United States Patent
Chang et al.

(10) Patent No.: US 12,232,402 B2
(45) Date of Patent: Feb. 18, 2025

(54) ORGANIC LIGHT-EMITTING DIODE DISPLAY DEVICE

(71) Applicant: LG Display Co., Ltd., Seoul (KR)

(72) Inventors: Su-Jin Chang, Paju-si (KR); Sung-Rae Lee, Paju-si (KR); Ju-Hun Min, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 579 days.

(21) Appl. No.: 17/374,914

(22) Filed: Jul. 13, 2021

(65) Prior Publication Data
US 2022/0020964 A1 Jan. 20, 2022

(30) Foreign Application Priority Data
Jul. 16, 2020 (KR) ........................ 10-2020-0088135

(51) Int. Cl.
| | |
|---|---|
| *H10K 59/80* | (2023.01) |
| *H10K 59/12* | (2023.01) |
| *H10K 59/35* | (2023.01) |
| *H10K 59/38* | (2023.01) |
| H10K 50/854 | (2023.01) |
| H10K 50/86 | (2023.01) |
| H10K 59/127 | (2023.01) |

(52) U.S. Cl.
CPC ......... *H10K 59/8791* (2023.02); *H10K 59/12* (2023.02); *H10K 59/35* (2023.02); *H10K 59/351* (2023.02); *H10K 59/38* (2023.02); *H10K 50/854* (2023.02); *H10K 50/86* (2023.02); *H10K 59/127* (2023.02)

(58) Field of Classification Search
CPC .... H10K 50/854; H10K 59/877; H10K 50/86; H10K 59/8791; H10K 59/12; H10K 59/131; H10K 59/1315; H10K 59/38
See application file for complete search history.

(56) References Cited

U.S. PATENT DOCUMENTS

| | | | |
|---|---|---|---|
| 2006/0238120 A1* | 10/2006 | Miller ................. | H10K 59/38 313/506 |
| 2009/0051276 A1* | 2/2009 | Inoue ................. | H10K 50/854 313/504 |
| 2014/0284557 A1* | 9/2014 | Choi ................... | H10K 50/856 257/40 |

(Continued)

FOREIGN PATENT DOCUMENTS

| | | | | |
|---|---|---|---|---|
| JP | 2010277059 A | * 12/2010 | ............... | G02B 1/11 |
| KR | 10-2017-0010931 A | 2/2017 | | |

(Continued)

*Primary Examiner* — Ratisha Mehta
*Assistant Examiner* — Brad A Knudson
(74) *Attorney, Agent, or Firm* — Seed IP Law Group LLP

(57) ABSTRACT

The present disclosure relates to an organic light-emitting diode display device that comprises a first substrate on which first, second and third subpixels each including an emission area and a non-emission area are defined; first, second and third light-emitting diodes disposed in the first, second and third subpixels on the first substrate, respectively; a second substrate over the first, second and third light-emitting diodes; and a scattering pattern corresponding to the first subpixel and disposed over the first light-emitting diode or under the first substrate, wherein the first subpixel has an area reflectance higher than the second and third subpixels.

20 Claims, 8 Drawing Sheets

(56) References Cited

U.S. PATENT DOCUMENTS

| | | | | |
|---|---|---|---|---|
| 2015/0129857 | A1* | 5/2015 | Lee | H10K 59/124 |
| | | | | 257/40 |
| 2017/0250233 | A1* | 8/2017 | Ushikubo | H10K 59/876 |
| 2018/0122874 | A1* | 5/2018 | Kim | H10K 59/38 |
| 2018/0277795 | A1* | 9/2018 | Liu | H10K 50/828 |
| 2019/0006328 | A1* | 1/2019 | Chen | H01L 27/1218 |
| 2020/0075682 | A1* | 3/2020 | Jeong | H10K 59/40 |
| 2020/0161579 | A1* | 5/2020 | Kim | H10K 59/38 |
| 2020/0161585 | A1* | 5/2020 | Palles-Dimmock | ............ |
| | | | | H10K 85/1135 |
| 2021/0408104 | A1* | 12/2021 | Lee | H01L 25/0753 |

FOREIGN PATENT DOCUMENTS

| | | | | |
|---|---|---|---|---|
| KR | 10-2017-0066736 A | | 6/2017 | |
| KR | 20180079095 A | * | 7/2018 | H01L 51/5218 |

\* cited by examiner

ORGANIC LIGHT-EMITTING DIODE DISPLAY DEVICE

CROSS-REFERENCE TO RELATED APPLICATION

The present application claims priority from and the benefit under 35 U.S.C § 119(a) of Korean Patent Application No. 10-2020-0088135 filed in the Republic of Korea on Jul. 16, 2020, which is hereby incorporated by reference in its entirety.

BACKGROUND

Technical Field

The present disclosure relates to an organic light-emitting diode display device, and more particularly, an organic light-emitting diode display device that can realize low reflection and high brightness and display an image with excellent color tones by preventing the displayed image from being modulated due to reflection of external light.

Discussion of the Related Art

Recently, with entering into a full-fledged information age, there is a growing interest in information display dealing with and displaying mass information. In addition, as the demand to use portable information media increases, various lightweight and thin flat panel display devices corresponding to this have been developed and have been in the spotlight.

Particularly, among the various flat panel display devices, an organic light-emitting diode (OLED) display device can be lightweight and thin because it is self-luminous and does not require a backlight unit used for a liquid crystal display device which is a nonluminous device.

The organic light-emitting diode display device also has wide viewing angles and high contrast ratio as compared with a liquid crystal display device and has advantages in power consumption. In addition, the organic light-emitting diode display device is driven by low voltages of direct current (DC) and has a fast response time. Further, the organic light-emitting diode display device is strong against the external impacts and is used in a wide range of temperatures because its components are solids.

Meanwhile, the contrast ratio of the organic light-emitting diode display device can be greatly reduced according to reflection by various lines or electrodes formed of metal. To prevent this, a circular polarizer is disposed on an upper surface of a display panel.

BRIEF SUMMARY

The inventors of the present disclosure have recognized such approach in the related art of disposing the circular polarizer on the upper surface of the display panel causes a problem of decreasing the overall luminance of the organic light-emitting diode display device. That is, since the transmittance of the circular polarizer is about 40%-50%, the luminance of the light emitted from the light-emitting diode is decreased by about 50% or more while passing through the circular polarizer.

To solve the problem in the related art, some approach such as incorporating an antireflection film including a light absorption layer may be disposed on the upper surface of the display panel instated of the circular polarizer have been suggested. However, the inventors of the present disclosure have appreciated that the antireflection film may generate a rainbow phenomenon and the rainbow phenomenon may worsen the visibility and may cause eye fatigue of the user.

Further, in the organic light-emitting diode including the antireflection film, light incident to the front of the organic light-emitting diode display device is not reflected to the outside to thereby lower the external light reflectance. However, the scattering reflectance in the off state increases, and light slantly incident on the display device at the side view is reflected more. Accordingly, the external light reflectance increases at the side view, and the visibility in the off state, that is, the black visibility can deteriorate, thereby causing a problem of decreasing the outdoor visibility and lowering the contrast ratio.

Therefore, the inventors have provided one or more embodiments that are directed to an organic light-emitting diode display device that substantially obviates one or more of the problems due to limitations and disadvantages of the related art. The embodiments of the present disclosure that the inventors propose are not limited to the technical problems identified above and addresses other problems in the related art not mentioned above.

An aspect of the present disclosure is to provide an organic light-emitting diode display device that can simultaneously implement the low reflectance and the high brightness.

Another aspect of the present disclosure is to provide an organic light-emitting diode display device that can prevent occurrence of the rainbow phenomenon.

Another aspect of the present disclosure is to provide an organic light-emitting diode display device that can decrease the external light reflectance at the side view and improve the contrast ratio.

Another aspect of the present disclosure is to provide an organic light-emitting diode display device that can realize an image with improved color tones.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, an organic light-emitting diode display device comprises a first substrate on which first, second and third subpixels each including an emission area and a non-emission area are defined; first, second and third light-emitting diodes disposed in the first, second and third subpixels on the first substrate, respectively; a second substrate over the first, second and third light-emitting diodes; and a scattering pattern corresponding to the first subpixel and disposed over the first light-emitting diode or under the first substrate, wherein the first subpixel has an area reflectance higher than the second and third subpixels.

It is to be understood that both the foregoing general description and the following detailed description are explanatory and are intended to provide further explanation of the inventive concepts as claimed.

BRIEF DESCRIPTION OF THE SEVERAL VIEWS OF THE DRAWINGS

The accompanying drawings, which are included to provide a further understanding of the present disclosure and which are incorporated in and constitute a part of this application, illustrate embodiments of the disclosure and together with the description serve to explain various principles of the present disclosure. In the drawings.

DETAILED DESCRIPTION

Reference will now be made in detail to embodiments of the disclosure, examples of which are illustrated in the accompanying drawings.

First Embodiment

Figure 1A:
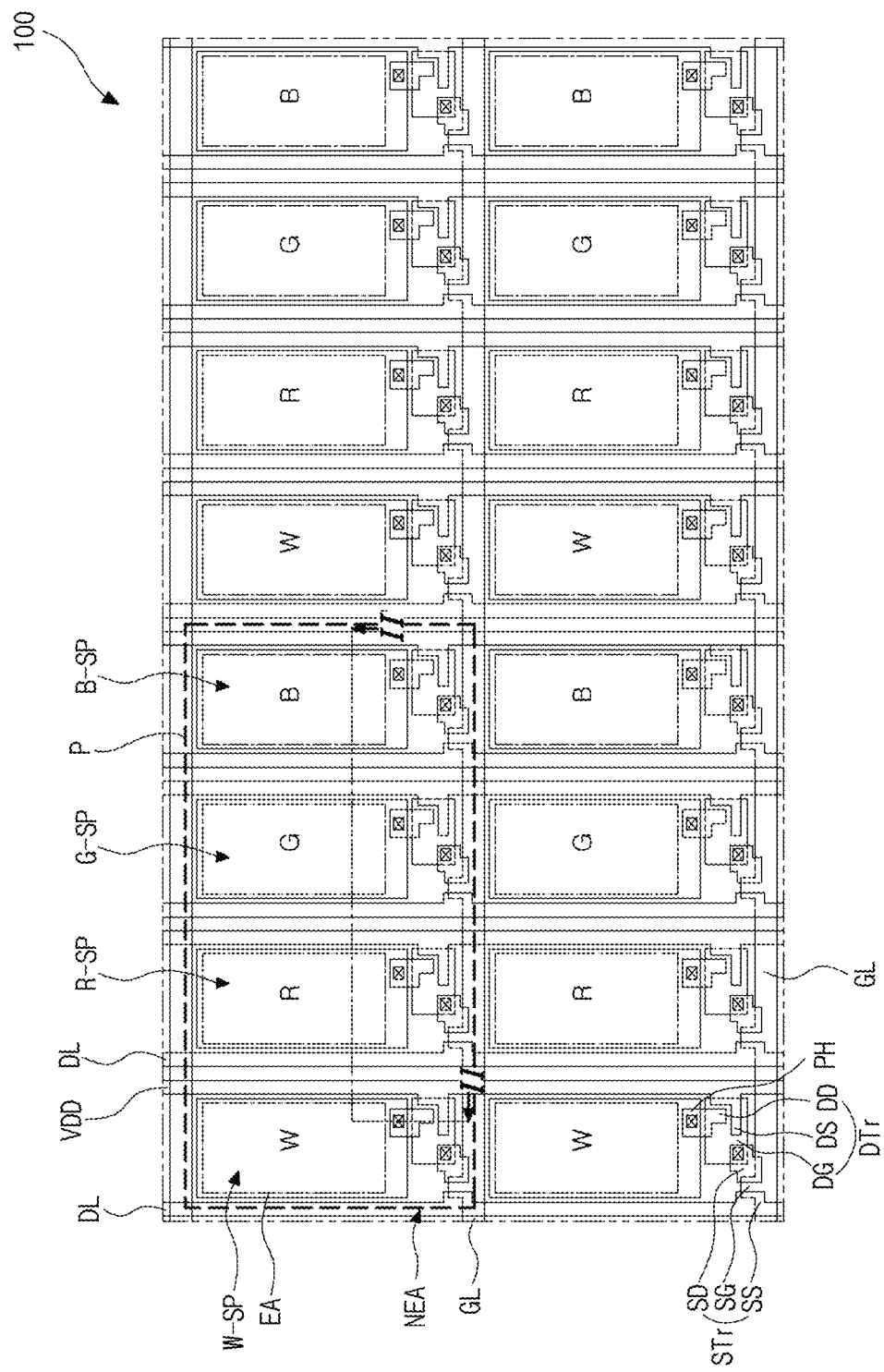
FIGS. 1A and 1B are plan and perspective views showing a plurality of subpixels in an organic light-emitting diode display device according to a first embodiment of the present disclosure, respectively.
Figure 1B:
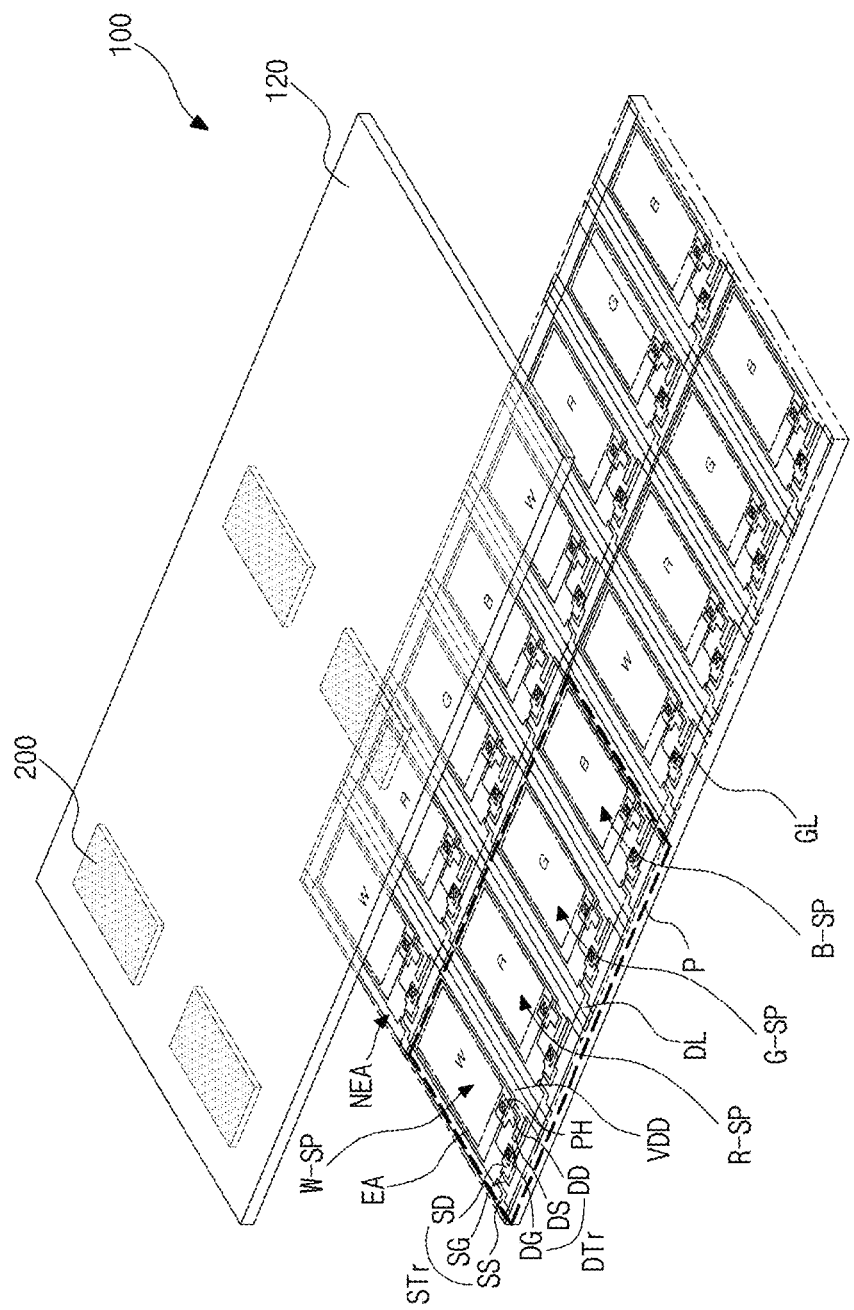

FIGS. 1A and 1B are plan and perspective views showing a plurality of subpixels in an organic light-emitting diode display device according to a first embodiment of the present disclosure, respectively.

Figure 2:
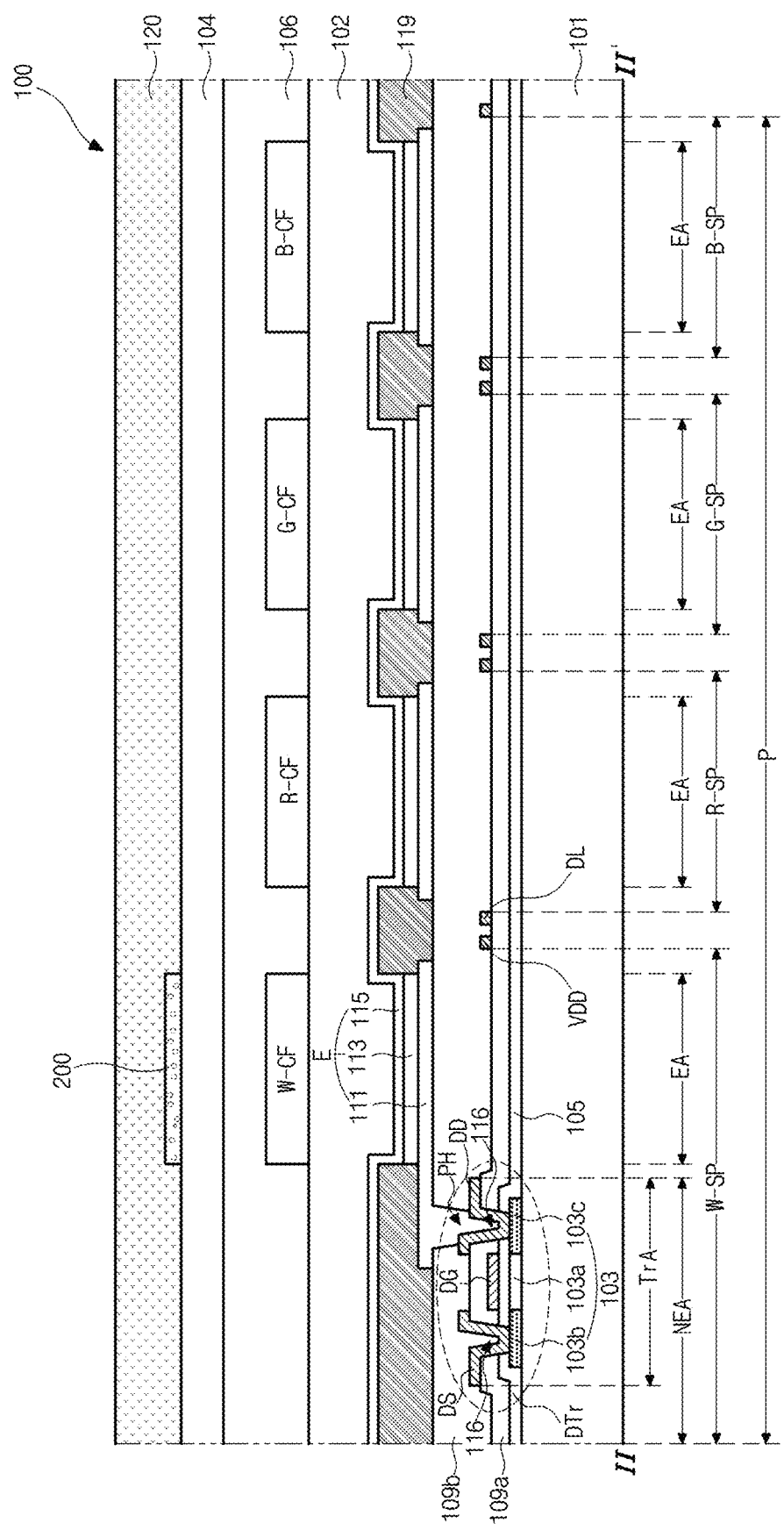
FIG. 2 is a cross-sectional view of the organic light-emitting diode display device according to the first embodiment of the present disclosure taken along line II-IP of FIG. 1A and shows a structure of a unit pixel including four subpixels.

As shown in FIGS. 1A and 1B, the organic light-emitting diode display device include a plurality of unit pixels P, each of which has red, green and blue subpixels R-SP, G-SP and B-SP. Each subpixel R-SP, G-SP and B-SP includes an emission area EA, and a bank 119 of FIG. 2 is disposed along an edge of the emission area EA to form a non-emission area NEA.

The red, green and blue subpixels R-SP, G-SP and B-SP may be alternately disposed along a first direction, for example, a horizontal direction in the context of the figures, and a plurality of the red, green or blue subpixels R-SP, G-SP or B-SP, e.g., the same color subpixels may be disposed along a second direction, for example, a vertical direction in the context of the figure.

Accordingly, the red, green and blue subpixels R-SP, G-SP and B-SP each may have a structure arranged in a stripe shape.

The unit pixel P may further include a white subpixel W-SP. The unit pixel P including the white, red, green and blue subpixels W-SP, R-SP, G-SP and B-SP may have a rectangular structure.

For convenience of explanation, each subpixel W-SP, R-SP, G-SP and B-SP is illustrated as being disposed side by side with the same width. Alternatively, the subpixels W-SP, R-SP, G-SP and B-SP may have various structures with different widths.

At this time, switching and driving thin film transistors STr and DTr are provided in the non-emission area NEA of each subpixel W-SP, R-SP, G-SP and B-SP and a light-emitting diode E of FIG. 2 including a first electrode 111 of FIG. 2, an organic light-emitting layer 113 of FIG. 2 and a second electrode 115 of FIG. 2 is disposed in the emission area EA of each subpixel W-SP, R-SP, G-SP and B-SP.

Alternatively, the switching and driving thin film transistors STr and DTr may be provided in the emission area EA of each subpixel W-SP, R-SP, G-SP and B-SP and may be disposed under the light-emitting diode E of FIG. 2. Each subpixel W-SP, R-SP, G-SP and B-SP may further include one or more thin film transistor in addition to the switching and driving thin film transistors STr and DTr.

Here, the switching thin film transistor STr and the driving thin film transistor DTr are connected to each other, and the driving thin film transistor DTr is connected to the light-emitting diode E of FIG. 2.

More particularly, a gate line GL, a data line DL and a power line VDD are disposed on a substrate 101 to define the subpixels W-SP, R-SP, G-SP and B-SP.

The switching thin film transistor STr is formed at a crossing portion of the gate line GL and the data line DL, and the switching thin film transistor STr selects each subpixel W-SP, R-SP, G-SP and B-SP.

The switching thin film transistor STr includes a gate electrode SG, a semiconductor layer (not shown), a source electrode SS and a drain electrode SD. The gate electrode SG is connected to the gate line GL, and the source electrode SS is connected to the data line DL. The gate electrode SG may be branched off from the gate line GL or may be a part of the gate line GL. The source electrode SS may be branched off from the data line DL or may be a part of the data line DL.

The driving thin film transistor DTr drives the light-emitting diode E of FIG. 2 of each subpixel W-SP, R-SP, G-SP and B-SP, which is selected by the switching thin film transistor STr. The driving thin film transistor DTr includes a gate electrode DG, a semiconductor layer 103 of FIG. 2, a source electrode DS and a drain electrode DD. The gate electrode DG is connected to the drain electrode SD of the switching thin film transistor STr, and the source electrode is connected to the power line VDD.

The drain electrode DD of the driving thin film transistor DTr is connected to the first electrode 111 of FIG. 2 of the light-emitting diode E of FIG. 2.

An organic light-emitting layer 113 of FIG. 2 is interposed between the first electrode 111 of FIG. 2 and the second electrode 115 of FIG. 2 of the light-emitting diode E of FIG. 2.

An antireflection film (AR film) 120 including a light absorption layer is disposed corresponding to the transmission direction of light emitted from the organic light-emitting layer 113 of FIG. 2. The antireflection film 120 increases absorption of the external light and the reflected external light. Therefore, the organic light-emitting diode display device 100 according to the first embodiment of the present disclosure can improve the luminance as compared with an organic light-emitting diode display device including a circular polarizer while reducing or minimizing the external light reflectance.

In the organic light-emitting diode display device 100 according to the first embodiment of the present disclosure, a scattering pattern 200 is further provided between the organic light-emitting layer 113 of FIG. 2 and the antireflection film 120. The scattering pattern 200 is disposed to correspond to the white subpixel W-SP among the subpixels W-SP, R-SP, G-SP and B-SP.

The scattering pattern 200 diffuses the light by refracting and scattering the incident light, and thus an interference spot, that is, a rainbow phenomenon, can be prevented from being caused by the external light reflection of the antireflection film 120.

Accordingly, the visibility can be prevented from deteriorating due to the rainbow phenomenon, and the viewer's eye fatigue can also be prevented from occurring.

In addition, it is possible to prevent an increase of the external light reflectance at the side view, and it is also possible to prevent a decrease of the black visibility in an off state, thereby improving the outdoor visibility and also improving the contrast ratio.

This will be described in more detail with reference to Table 1 below.

TABLE 1

|  | Region reflectance | Area reflectance |
| --- | --- | --- |
| R subpixel | 9.70% | 3.01% |
| G subpixel | 27.50% | 5.25% |
| B subpixel | 9.60% | 2.07% |
| W subpixel | 64.50% | 18.28% |
| Total |  | 28.61% |

Table 1 is an experiment result measuring a region reflectance and an area reflectance according to the size of the emission area EA for each subpixel W-SP, R-SP, G-SP and B-SP of the related art organic light-emitting diode display device. The area reflectance was measured as the reflectance to the equal area according to the region reflectance.

From Table 1, it can be seen that the area reflectance in the emission area EA of the white subpixel W-SP is relatively high as compared with the area reflectance in the emission area EA of each of the red, green and blue subpixels R-SP, G-SP and B-SP.

This means that the external light reflectance in the white subpixel W-SP is higher than the external light reflectance in each of the red, green and blue subpixels R-SP, G-SP and B-SP even if the white, red, green and blue subpixels W-SP, R-SP, G-SP and B-SP have the same area, and thus means that the external light reflectance of the organic light-emitting diode display device 100 is highly influenced by the area reflectance in the white subpixel W-SP as compared to the area reflectance in each of the red, green and blue subpixels R-SP, G-SP and B-SP.

Further, this means that in the organic light-emitting diode display device 100, the rainbow phenomenon, which is the interference spot due to the external light reflection, is generated by the white subpixel W-SP having the relatively high area reflectance, and also means that the external light reflectance at the side view is increased due to the white subpixel W-SP and the black visibility is decreased, thereby lowering the contrast ratio as well as the outdoor visibility.

Accordingly, in the organic light-emitting diode display device 100 according to the first embodiment of the present disclosure, the scattering pattern 200 is disposed to correspond to the white subpixel W-SP highly affecting the external light reflectance of the organic light-emitting diode display device 100, so that the external light reflectance in the white subpixel W-SP is further lowered.

As described above, by further decreasing the external light reflectance in the white subpixel W-SP, the overall external light reflectance of the organic light-emitting diode display device 100 can be further lowered, and the rainbow phenomenon can be prevented from occurring. In addition, the external light reflectance at the side view is also lowered, thereby improving the contrast ratio.

Therefore, it is possible to provide the organic light-emitting diode display device 100 that can display an image with improved color tones.

Further, in some embodiments, since the scattering pattern 200 is disposed to correspond to only the white subpixel W-SP, there is no influence on the luminance in the red, green and blue subpixels R-SP, G-SP and B-SP, which do not significantly affect the external light reflectance of the organic light-emitting diode display device 100, so that the luminance in the red, green and blue subpixels R-SP, G-SP and B-SP cannot be lowered.

Accordingly, the overall external light reflectance of the organic light-emitting diode display device 100 can be further lowered, the rainbow phenomenon can be prevented or the contrast ratio can be improved while a decrease in the luminance of the organic light-emitting diode display device 100 can be prevented.

The scattering pattern 200 is disposed to correspond to the transmission direction of the light emitted from the organic light-emitting layer 113 of FIG. 2 and can be positioned on a passivation layer 102 of FIG. 2 or an encapsulation substrate 104 of FIG. 2 for encapsulating the organic light-emitting diode display device 100. This will be described in more detail with reference to FIG. 2.

FIG. 2 is a cross-sectional view of the organic light-emitting diode display device according to the first embodiment of the present disclosure taken along line II-IP of FIG. 1A and shows a structure of a unit pixel including four subpixels.

In FIG. 2, one unit pixel P includes white, red, green and blue subpixels W-SP, R-SP, G-SP and B-SP. Each subpixel W-SP, R-SP, G-SP and B-SP includes an emission area EA, and a bank 119 is disposed along an edge of the emission area EA to form a non-emission area NEA.

A semiconductor layer 103 is disposed in a switching area TrA of the non-emission area NEA of each subpixel W-SP, R-SP, G-SP and B-SP on a substrate 101, which may be referred to as a first substrate. The semiconductor layer 103 may be formed of silicon and may include an active region 103a of forming a channel at its center and source and drain regions 103b and 103c highly doped with impurities at both sides of the active region 103a. Alternatively, the semiconductor layer 103 may be formed of an oxide semiconductor material, and in this case, the source and drain regions 103b and 103c may not be doped with impurities.

A gate insulation layer 105 is disposed on the semiconductor layer 103.

A gate electrode DG and the gate line GL are provided on the gate insulation layer 105. The gate electrode DG is disposed to correspond to the active region 103a of the semiconductor layer 103.

A first interlayer insulation layer 109a is disposed on the gate electrode DG and the gate line GL. The first interlayer insulation layer 109a and the gate insulation layer 105 thereunder have first and second semiconductor contact holes 116 exposing the source and drain regions 103b and 103c at both sides of the active region 103a, respectively.

Next, source and drain electrodes DS and DD are provided on the first interlayer insulation layer 109a including the first and second semiconductor contact holes 116 and are spaced apart from each other. The source and drain electrodes DS and DD are in contact with the source and drain regions 103b and 103c exposed by the first and second semiconductor contact holes 116, respectively.

A second interlayer insulation layer 109b is disposed on the source and drain electrodes DS and DD and the first interlayer insulation layer 109a exposed between the source and drain electrodes DS and DD.

Here, the source and drain electrodes DS and DD, the semiconductor layer 103 including the source and drain regions 103b and 103c contacting the source and drain electrodes DS and DD, the gate insulation layer 105 on the semiconductor layer 103, and the gate electrode DG constitute the driving thin film transistor DTr.

Meanwhile, the switching thin film transistor STr of FIG. 1B having the same structure as the driving thin film transistor DTr is also formed on the substrate 101 and is connected to the driving thin film transistor DTr.

In the figure, the driving thin film transistor DTr is illustrated as an example of a top gate type in which the gate electrode DG and the source and drain electrodes DS and DD are disposed over the semiconductor layer 103 and the semiconductor layer 103 is formed of polycrystalline silicon or oxide semiconductor material. Alternatively, the driving thin film transistor DTr may be provided as a bottom gate type in which the gate electrode DG is disposed under the semiconductor layer 103, the source and drain electrodes DS and DD are disposed over the semiconductor layer 103, and the semiconductor layer 103 includes an active layer of intrinsic amorphous silicon and ohmic contact layers of impurity-doped amorphous silicon.

When the semiconductor layer 103 is formed of the oxide semiconductor material, a light-blocking layer (not shown) may be further formed under the semiconductor layer 103, and a buffer layer (not shown) may be further formed between the light-blocking layer (not shown) and the semiconductor layer 103.

The second interlayer insulation layer 109b includes a drain contact hole PH exposing the drain electrode DD of the driving thin film transistor DTr. A first electrode 111 is disposed on the second interlayer insulation layer 109b and is connected to the drain electrode DD of the driving thin film transistor DTr through the drain contact hole PH. The first electrode 111 may be formed of a material having relatively high work function and may function as an anode electrode.

The first electrode 111 is disposed for each subpixel W-SP, R-SP, G-SP and B-SP, and the bank 119 is disposed between adjacent first electrodes 111. Namely, the first electrodes 111 are separated from each other with the bank 119 as a boundary for each subpixel W-SP, R-SP, G-SP and B-SP. The bank 119 overlaps and contacts edges of the first electrode 111 and exposes a central portion of the first electrode 111.

An organic light-emitting layer 113 is disposed on the first electrode 111 exposed by the bank 119. The organic light-emitting layer 113 may be a single layer formed of a luminous material. Alternatively, the organic light-emitting layer 113 may be multiple layers including a hole injection layer (HIL), a hole transport layer (HTL), an emitting material layer (EML), an electron transport layer (ETL), and an electron injection layer (EIL) in order to increase luminance efficiency.

In the organic light-emitting diode display device 100 according to the first embodiment of the present disclosure, white light is emitted from the organic light-emitting layer 113 of each subpixel W-SP, R-SP, G-SP and B-SP.

A second electrode 115 is formed on the organic light-emitting layer 113. The second electrode 115 may be disposed substantially all over the substrate 101 and may function as a cathode electrode.

The second electrode 115 may be formed of a material having a relatively low work function, for example.

In the organic light-emitting diode display device 100, a predetermined or selected voltage is applied to the first electrode 111 and the second electrode 115 according to a selected signal, a hole injected from the first electrode 111 and an electron injected from the second electrode 115 are transported into the organic light-emitting layer 113 to form an exciton, and light is emitted and outputted in the form of visible light when the exciton is transitioned from the excited state to the ground state.

Here, the organic light-emitting diode display device 100 according to the first embodiment of the present disclosure is a top emission type in which the white light emitted from the organic light-emitting layer 113 is outputted to the outside through the second electrode 115, and through this, the organic light-emitting diode display device 100 finally implements an arbitrary image.

In the top emission type display device, the switching and driving thin film transistors STr of FIG. 1 and DTr can be widely provided under the bank 119 and the first electrode 111, so that there is an advantage that the top emission type display device has a wide design area for the thin film transistors as compared to a bottom emission type display device. Further, since the top emission type display device has the wider emission area EA than the bottom emission type display device having the same size, the luminance can be increased, and the power consumption can be lowered. In the figure, it is shown that the driving thin film transistor DTr is disposed under the bank 119 in the non-emission area NEA, but the present disclose is not limited thereto. Alternatively, the driving thin film transistor DTr may be disposed under the first electrode 111 in the emission area EA.

At this time, the first electrode 111 of the anode electrode can include a metal material having relatively high reflectance. For example, the first electrode 111 can be formed of aluminum (Al) or formed as a stacked structure of aluminum and ITO. The second electrode 115 of the cathode electrode can be formed of a transparent conductive material such as ITO or IZO or formed of a semitransparent metal material such as magnesium (Mg), silver (Ag) or an alloy of magnesium and silver such that light emitted from the organic light-emitting layer 113 passes therethrough.

A passivation layer 102 and an encapsulation substrate 104 in the form of a thin film are sequentially disposed over the thin film transistors STr of FIG. 1B and DTr and the light-emitting diode E. The passivation layer 102 prevents moisture from permeating each subpixel W-SP, R-SP, G-SP and B-SP, thereby protecting the organic light-emitting layer 113 which is vulnerable to external moisture or oxygen. The encapsulation substrate 104 may be referred to as an encap substrate or a second substrate.

Further, the passivation layer 102 protects the thin film transistors STr of FIG. 1B and DTr and the organic light-emitting diode E from the external impacts and also functions as attaching the substrate 101 and the encapsulation substrate 104.

Accordingly, the organic light-emitting diode display device 100 is encapsulated.

At this time, a color conversion layer 106 is disposed on an inner surface of the encapsulation substrate 104. The color conversion layer 106 includes white, red, green and blue color filter patterns W-CF, R-CF, G-CF and B-CF corresponding to the white, red, green and blue subpixels W-SP, R-SP, G-SP and B-SP, respectively.

The color conversion layer 106 converts the color of the white light emitted from the organic light-emitting layer 113. The white, red, green and blue color filter patterns W-CF, R-CF, G-CF and B-CF of the color conversion layer 106 are disposed to correspond to the emission areas EA of the white, red, green and blue subpixels W-SP, R-SP, G-SP and B-SP, respectively.

Accordingly, the organic light-emitting diode display device 100 according to the first embodiment of the present disclosure emits white, red, green and blue colors for the white, red, green and blue subpixels W-SP, R-SP, G-SP and B-SP, respectively, thereby implementing a full color image with high brightness.

At this time, the white color filter pattern W-CF may be omitted in the emission area EA of the white subpixel W-SP, so that the white light emitted from the organic light-emitting layer 113 may be transmitted as it is.

An antireflection film 120 is further disposed on an outer surface of the encapsulation substrate 104. The antireflection film 120 increases the absorption of the external light and the reflected external light.

The antireflection film 120 may include multiple layers of various materials and may further include a light absorption layer. In addition, the antireflection film 120 may further include a surface treatment layer for surface treatment. For example, the surface treatment layer may be an antireflective (AR) layer.

The light absorption layer may be formed of an adhesive or a support layer, and a light absorbing material may be included in the adhesive or the support layer.

The light absorbing material absorbs the external light, and the light absorbing material absorbs the reflected external light once again when the external light introduced into the organic light-emitting diode display device 100 is reflected. Since the light absorbing material absorbs the light within a range of predetermined or selected wavelengths which is the most sensitive to the human eye, it is possible to lower the reflectance of the light that is the most sensitive to the human eye.

The light absorption layer including the light absorbing material can be formed of one of a material including nanoparticles, an opaque dye material or a photoresist material, but is not limited thereto. The light absorbing material may include any material with properties capable of absorbing the incident external light or the reflected external light.

In the case of including nanoparticles, the incident light or reflected light may be scattered to thereby provide a low reflection effect. In the case of the photoresist or dye material, it may have a light color such as the opaque photoresist, and this does not distort the color of the color filter such as gray or light white or the photoresist which does not affect the visibility can be formed as the light absorbing material.

The support layer of the antireflection layer 120 may be formed of a Polyethylene terephthalate (PET), Tri-Acetyl Cellulose (TAC) or the like.

In the organic light-emitting diode display device 100 according to the first embodiment of the present disclosure, a scattering pattern 200 is further provided on the outer surface of the encapsulation substrate 104 corresponding to the white subpixel W-SP. The scattering pattern 200 may be interposed between the encapsulation substrate 104 and the antireflection film 120.

The scattering pattern 200 can include a transparent resin and a light diffusion material in the transparent resin, and the light diffusion material may be a bead.

The bead has a characteristic of preventing the light from being partially concentrated by dispersing the light incident on the scattering pattern 200.

A material having high transparency, improved light transmittance and easy viscosity control may be used as the transparent resin. For example, an acrylic, urethane, epoxy, vinyl, polyester, or polyamide resin can be used as the transparent resin.

The bead may be formed of an inorganic material such as $SiO_2$ or other materials. Alternatively, the bead may be formed of calcium carbonate, barium sulfate, silica, titanium oxide, glass, or poly(methyl methacrylate) (PMMA).

The scattering pattern 200 may be a fine pattern directly formed on the encapsulation substrate 104 without the light diffusion material such as the bead. The light scattering angle can be adjusted according to the shape of the fine pattern. The fine pattern can be variously configured as an elliptical pattern, a polygonal pattern, or the like. The hologram pattern may be used to refract the incident light by the interference pattern towards an asymmetric direction thereto, so that the concentrated light can be diffused at a more inclined angle.

In other way, the scattering pattern 200 may include the light diffusion material such as the bead in the transparent resin, and the fine pattern may be further formed on the surface of the scattering pattern 200. Alternatively, the scattering pattern 200 may be formed such that a plurality of fine unevenness may be provided on the surface, thereby having a surface roughness.

Here, the surface roughness refers to irregular unevenness formed on the surface of the processed material and having a short period and relatively small amplitude. The fine unevenness having such a roughness can be formed on the surface of the scattering pattern 200 according to the first embodiment of the present disclosure.

The scattering pattern 200 may refract and scatter the incident light, so that the external light reflectance of the white subpixel W-SP can be lowered.

That is, the external light incident on the white subpixel W-SP from the outside is scattered by the scattering pattern 200 to thereby prevent the phenomenon that the external light enters in one direction and causes the direct light reflection. In addition, when the light incident from the outside is reflected in the white subpixel W-SP and is outputted to the outside again, the light is diffused and reduced by being refracted and scattered by the scattering pattern 200.

Through this, the external light reflectance in the white subpixel W-SP is lowered, and it is also possible to prevent the external light from being visually recognized as direct light.

Further, in the process of outputting the light emitted from the organic light-emitting layer, the light extraction effect is improved by the scattering pattern 200, so that the emission efficiency of the internal light can also be increased.

Particularly, by lowering the external light reflectance in the white subpixel W-SP as described above, the organic light-emitting diode display device 100 according to the first embodiment of the present disclosure can prevent the occurrence of the rainbow phenomenon, which is an interference spot caused by the external light reflection, deteriorating visibility and also causing the eye fatigue.

Figure 3A:
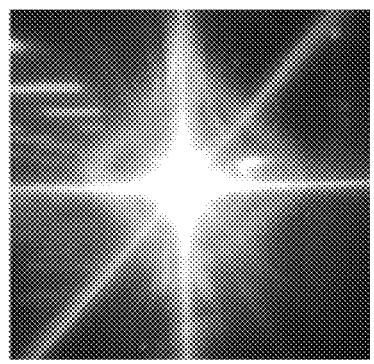
FIG. 3A and FIG. 3B are experimental results for evaluating the rainbow phenomenon.
Figure 3B:
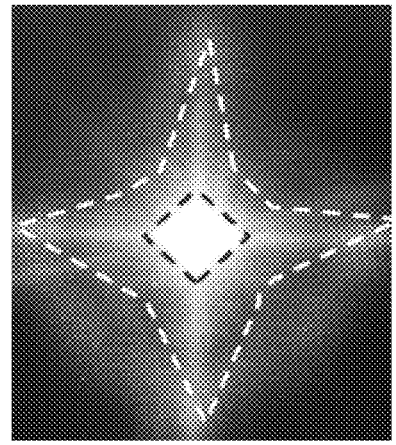

FIG. 3A and FIG. 3B are experimental results for evaluating the rainbow phenomenon, and the luminance was measured using a luminance measuring device (EZContrast of EDLIM).

FIG. 3A shows an organic light-emitting diode display device including an antireflection film, and it can be seen that the rainbow phenomenon has occurred. The rainbow phenomenon occurs from the interference spot caused by the external light reflection because of the retardation characteristic due to the antireflection film.

In contrast, as shown in FIG. 3B, it can be seen that the organic light-emitting diode display device 100 according to the first embodiment of the present disclosure has almost no rainbow phenomenon.

Namely, by further disposing the scattering pattern 200 corresponding to the white subpixel W-SP having the greatest effect on the external light reflectance of the organic light-emitting diode display device 100, the organic light-emitting diode display device 100 according to the first embodiment of the present disclosure can lower the external light reflectance in the white subpixel W-SP, thereby suppressing the occurrence of the interference stripes caused by the light interference.

In addition, the organic light-emitting diode display device 100 according to the first embodiment of the present disclosure can decrease the external light reflectance at the side view while preventing the occurrence of the rainbow phenomenon as described above.

Figure 4A:
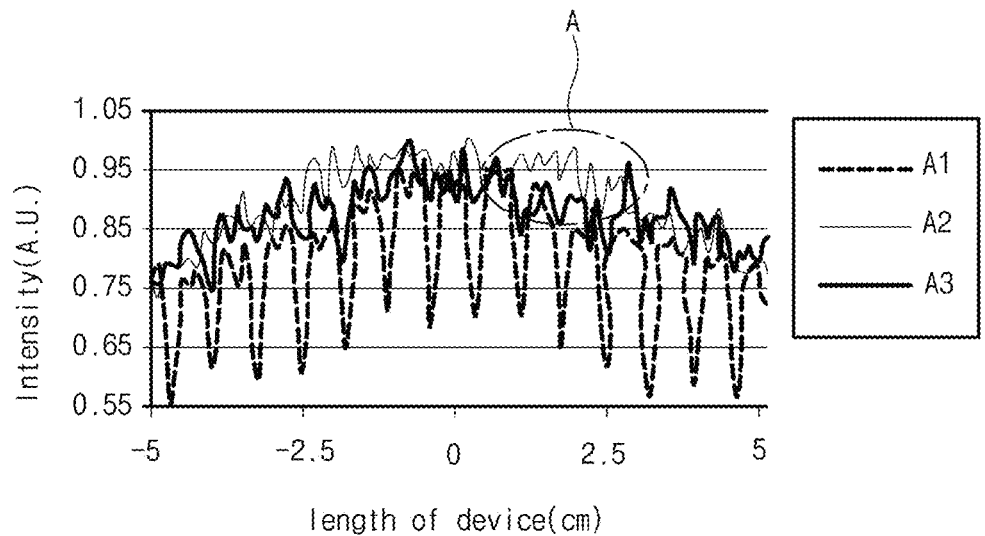
FIG. 4A is a graph of the measured external light reflectance.
Figure 4B:
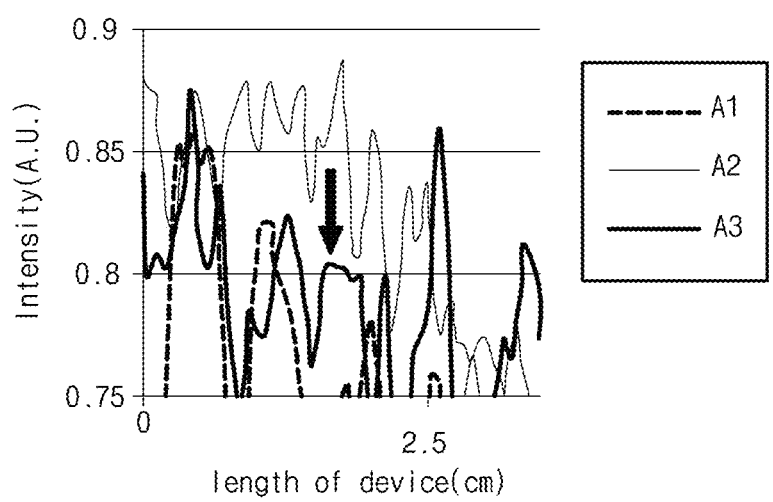
FIG. 4B is a graph showing an enlarged area A of FIG. 4A.

FIG. 4A is a graph of the measured external light reflectance, and FIG. 4B is a graph showing an enlarged area A of FIG. 4A. Here, the X-axis represents the luminance measurement position of the external light reflectance according to the horizontal length of the device, and the Y-axis shows the relative value for the luminance of the external light reflectance, which is the normalized value based on the luminance of the external light reflectance of 1.0.

In the graphs of FIGS. 4A and 4B, A1 denotes a general organic light-emitting diode display device without an antireflection film, and A2 denotes an organic light-emitting diode display device with an antireflection film.

Further, A3 denotes the organic light-emitting diode display device 100 according to the first embodiment of the present disclosure.

Referring to the graphs of FIGS. 4A and 4B, it can be seen that the general organic light-emitting diode display device without the antireflection film of A1 has a larger difference in the luminance of the external light reflectance.

On the other hand, it can be seen that there does not largely occur the luminance difference of the external light reflectance in the organic light-emitting diode display devices with the antireflection film of A2 and A3. At this time, it can be seen that the organic light-emitting diode display device with only the antireflection film of A2 has a large difference in the luminance of the external light reflectance at the side view.

In particular, when the luminance intensity of the external light reflectance at the side view is 0.8 (A.U.) or more, this means that the black visibility in the off state deteriorates. In the case of the device A2, it can be seen that the luminance intensity of the external light reflectance at the side view is higher than 0.8 (A.U.).

As described above, when the external light reflectance at the side view increases, the scattering reflectance in the off state of the display device increases, so that the black visibility, which is the visibility in the off state, can be decreased. According to this, there is a problem that not only the outdoor visibility but also the contrast ratio are lowered.

On the other hand, in the organic light-emitting diode display device 100 according to the first embodiment of the present disclosure provided with the antireflection film 120 and the scattering pattern 200 corresponding to the white subpixel W-SP of A3, there does not largely occur the luminance difference of the external light reflectance at the side view, and the luminance intensity is measured to be 0.8 (A.U.) or less. This is because the scattering reflectance in the off state is also lowered by lowering the external light reflectance in the white subpixel W-SP.

Accordingly, it is possible to prevent the black visibility, which is the visibility in the off state, from deteriorating, and finally, it is possible to provide the organic light-emitting diode display device 100 with the improved outdoor visibility and contrast ratio.

As described above, the organic light-emitting diode display device 100 according to the first embodiment of the present disclosure includes the antireflection film 120 with the light absorption layer, thereby improving the luminance as compared with the organic light-emitting diode display device including the circular polarizer while reducing or minimizing the external light reflectance.

In addition, by disposing the scattering pattern 200 corresponding to the white subpixel W-SP between the organic light-emitting layer 113 and the antireflection film 120, it is possible to prevent the occurrence of the rainbow phenomenon due to the external light reflection by the antireflection film 120, so that the visibility can be prevented from deteriorating due to the rainbow phenomenon and the viewer's eye fatigue can also be prevented from occurring.

Further, it is possible to prevent the external light reflectance from increasing at the side view, and thus, it is also possible to prevent the black visibility in the off state from deteriorating, thereby improving the outdoor visibility and the contrast ratio.

Accordingly, it is possible to implement the organic light-emitting diode display device capable of realizing an image with improved color tones.

In the organic light-emitting diode display device 100 according to the first embodiment of the present disclosure, the above effects can be brought by disposing the scattering pattern 200 only corresponding to the white subpixel W-SP, and this will be described in more detail hereafter.

Figure 5A:
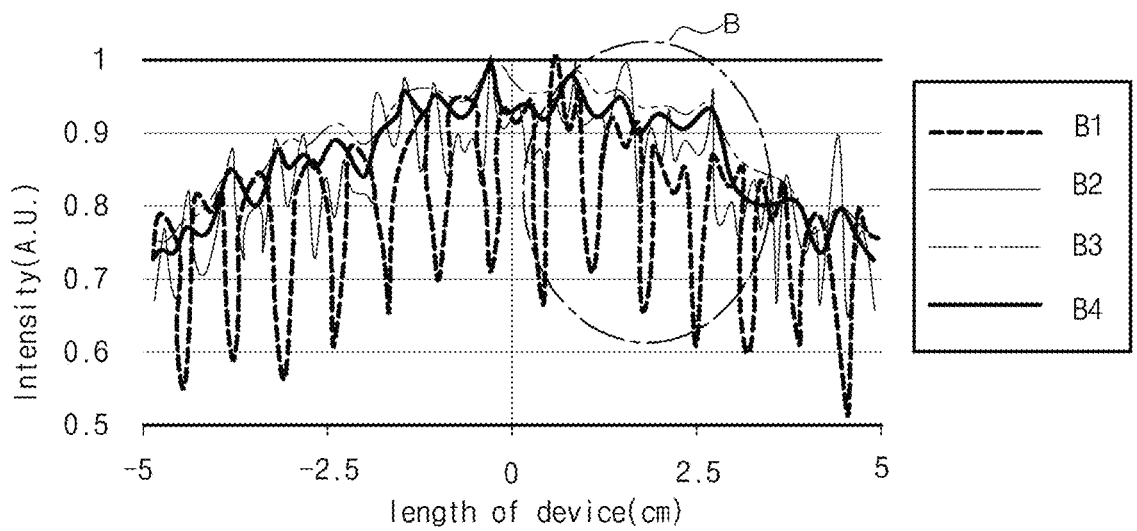
FIG. 5A is a graph of the measured external light reflectance according to the application of the scattering pattern.
Figure 5B:
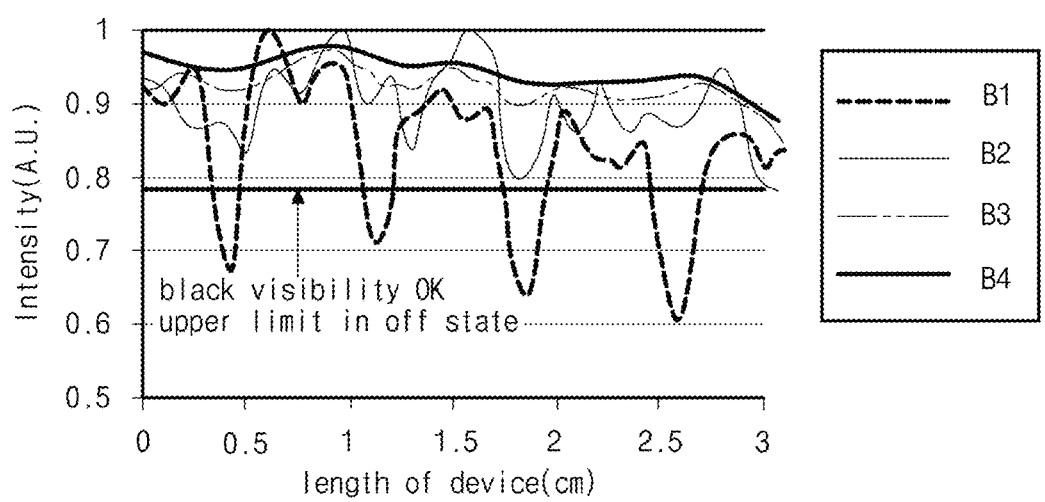
FIG. 5B is a graph showing an enlarged area B of FIG. 5A.

FIG. 5A is a graph of the measured external light reflectance according to the application of the scattering pattern, and FIG. 5B is a graph showing an enlarged area B of FIG. 5A.

In FIGS. 5A and 5B, the X-axis represents the luminance measurement position of the external light reflectance according to the horizontal length of the device, and the Y-axis shows the relative value for the luminance of the external light reflectance, which is the normalized value based on the luminance of the external light reflectance of 1.0. Additionally, B1 denotes an organic light-emitting diode display device without a scattering pattern, B2 denotes an organic light-emitting diode display device with a scattering pattern having the haze value of 15(±5)% on the entire surface, B3 denotes an organic light-emitting diode display device with a scattering pattern having the haze value of 40(±5)% on the entire surface, and B4 denotes an organic light-emitting diode display device with a scattering pattern having the haze value of 60(±5)% on the entire surface.

Prior to the description, all of B1 to B4 include an antireflection film.

Referring to FIG. 5A and FIG. 5B, when the luminance intensity of the external light reflectance at the side view is 0.8 (A.U.) or less, this means that the black visibility in the off state does not deteriorate.

Here, the external light reflectance at the side view having the luminance intensity of 0.8 (A.U.) or less means the luminance intensity of 80% based on the central luminance intensity.

On the other hand, it can be seen that all of B2, B3 and B4 except for B1 have the external light reflectance of 0.8 (A.U.) or more at the side view.

This means that the external light reflectance at the side view appears to be high when the scattering pattern having the haze value of 15(±5)%-60(±5)% is disposed on the entire surface of the subpixels as compared to the case in which the scattering pattern is not provided.

Accordingly, it is beneficial to implement an organic light-emitting diode display device without a scattering pattern in order to prevent the black visibility in the off state at the side view from deteriorating. However, when only the antireflection film is provided without the scattering pattern, the rainbow phenomenon may occur.

This will be described in more detail with reference to Table 2 below.

Table 2 is the experimental results showing the evaluation of the rainbow phenomenon and the black visibility in the off state according to the application of the scattering pattern.

TABLE 2

|  |  | B1 | B2 | B3 | B4 |
|---|---|---|---|---|---|
| FOS (Front of Screen Test) Level | Black visibility in off state | Lv. 1 | Lv. 2 | Lv. 3 | Lv. 5 |
|  | Rainbow phenomenon | Lv. 5 | Lv. 4 | Lv. 1 | Lv. 1 |

In Table 2, Lv. 0~Lv.2 represent okay (OK) levels, and Lv.3 Lv.5 represent not good (NG) levels.

From Table 2, when the scattering pattern disposed on the entire surface of the subpixels has the haze value of 15(±5)% or less, it can be seen that the black visibility in the off state has the OK level. However, at this time, the rainbow phenomenon has the NG level.

This means that when the scattering pattern is not provide or the scattering pattern having the haze value of 15% or less is disposed on the entire surface of the subpixels, the decrease of the black visibility in the off state can be prevented, but the rainbow phenomenon still occurs.

Table 3 is the experimental results showing the evaluation of the rainbow phenomenon and the black visibility in the off state according to the haze values of the scattering pattern.

TABLE 3

|  |  | C1 | C2 | C3 | C4 | C5 |
|---|---|---|---|---|---|---|
| FOS (Front of Screen Test) Level | Black visibility in off state | Lv. 1 | Lv. 2 | Lv. 3 | Lv. 4 | ≥Lv. 5 |
|  | Rainbow phenomenon | Lv. 5 | Lv. 3 | Lv. 1 | ← | ← |

In Table 3, C1 denotes an organic light-emitting diode display device without a scattering pattern, C2 denotes an organic light-emitting diode display device with a scattering pattern having the haze value of 5(±5)% on the entire surface, C3 denotes an organic light-emitting diode display device with a scattering pattern having the haze value of 30(±5)% on the entire surface, C4 denotes an organic light-emitting diode display device with a scattering pattern having the haze value of 45(±5)% on the entire surface, and C3 denotes an organic light-emitting diode display device with a scattering pattern having the haze value of 70(±5)% on the entire surface.

From Table 3, when the scattering pattern disposed on the entire surface of the subpixels has the haze value of 30% or more, it can be seen that the rainbow phenomenon has the OK level, but the black visibility in the off state has the NG level.

On the other hand, Table 4 below is the experimental results showing the evaluation of the rainbow phenomenon and the black visibility in the off state according to the haze values of the scattering pattern of the organic light-emitting diode display device according to the first embodiment of the present disclosure.

TABLE 4

|  |  | D1 | D2 | D3 | D4 |
|---|---|---|---|---|---|
| FOS (Front of Screen Test) Level | Black visibility in off state | Lv. 1 | Lv. 3 | Lv. 2 | Lv. 1 |
|  | Rainbow phenomenon | Lv. 5 | Lv. 2 | Lv. 2 | Lv. 4 |

D1 denotes an organic light-emitting diode display device without a scattering pattern, D2 denotes the organic light-emitting diode display device with the scattering pattern having the haze value of 60(±5)% corresponding to the white subpixel, D3 denotes the organic light-emitting diode display device with the scattering pattern having the haze value of 45(±5)% corresponding to the white subpixel, and D4 denotes the organic light-emitting diode display device with the scattering pattern having the haze value of 200 (±5)% corresponding to the white subpixel.

Form Table 4, it can be seen that when the scattering pattern has the haze value of 45(±5)%, both the rainbow phenomenon and the black visibility in the off state have the OK levels.

Namely, in the organic light-emitting diode display device including the antireflection film (AR film) with the light absorption layer, by disposing the scattering pattern having the haze value of 45(±5)% corresponding to the white subpixel between the organic light-emitting layer 113 of FIG. 2 and the antireflection film, it is possible to prevent the rainbow phenomenon and the decrease of the black visibility in the off state.

As described above, the organic light-emitting diode display device 100 according to the first embodiment of the present disclosure includes the antireflection film 120 with the light absorption layer, and the scattering pattern 200 is disposed to correspond to the white subpixel W-SP between the organic light-emitting layer 113 and the antireflection film 120. Therefore, the luminance can be improved, and the external light reflectance can be reduced or minimized as compared to the organic light-emitting diode display device including the circular polarizer. Further, it is possible to prevent the occurrence of the rainbow phenomenon due to the external light reflection, so that the visibility can be prevented from deteriorating due to the rainbow phenomenon and the viewer's eye fatigue can also be prevented from occurring.

In addition, it is possible to prevent the external light reflectance from increasing at the side view, and thus it is also possible to prevent the black visibility in the off state from deteriorating, thereby improving the outdoor visibility and the contrast ratio.

Through this, it is possible to implement the organic light-emitting diode display device 100 capable of realizing an image with improved color tones.

Second Embodiment

Figure 6:
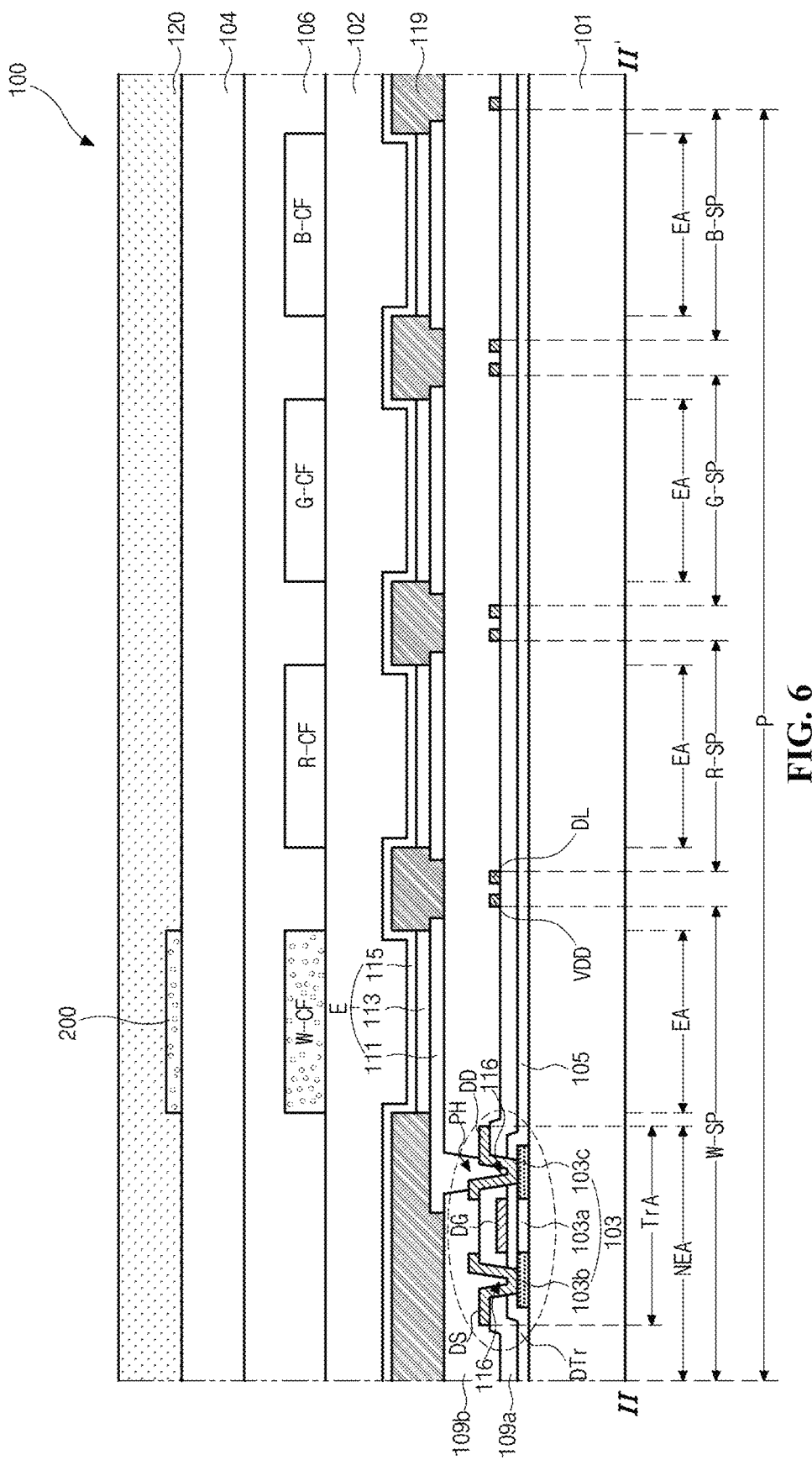
FIG. 6 is a cross-sectional view of an organic light-emitting diode display device according to a second embodiment of the present disclosure and shows a structure of a unit pixel including four subpixels.

FIG. 6 is a cross-sectional view of an organic light-emitting diode display device according to a second embodiment of the present disclosure and shows a structure of a unit pixel including four subpixels.

For convenience of description, the same parts as those of the first embodiment are designated by the same reference signs, and explanation for the same parts will be shortened or omitted.

In FIG. 6, a driving thin film transistor DTr including a semiconductor layer 103, a gate insulation layer 105, a gate electrode DG, and source and drain electrodes DS and DD is disposed in a switching area TrA of a non-emission area NEA on a substrate 101, and a first electrode 111 connected to the drain electrode DD exposed through a drain contact hole PH, which is formed in the gate insulation layer 105 and a first interlayer insulation layer 109a, is disposed on a second interlayer insulation layer 109b corresponding to an emission area EA.

At this time, the first electrode 111 is disposed for each subpixel W-SP, R-SP, G-SP and B-SP, and a bank 119 is disposed between adjacent first electrodes 111.

An organic light-emitting layer 113 is disposed on the first electrode 111 exposed by the bank 119, and a second electrode 115 is disposed on the organic light-emitting layer 113 substantially all over the substrate 101. The first electrode 111 may function as an anode electrode and the second electrode 115 may function as a cathode electrode.

A passivation layer 102 and an encapsulation substrate 104 in the form of a thin film are sequentially disposed over the driving thin film transistor DTr and the light-emitting diode E, thereby encapsulating the organic light-emitting diode display device 100.

A color conversion layer 106 is disposed on the inner surface of the encapsulation substrate 104. The color conversion layer 106 includes the white, red, green and blue color filter patterns W-CF, R-CF, G-CF and B-CF corresponding to the white, red, green and blue subpixels W-SP, R-SP, G-SP and B-SP, respectively.

The color conversion layer 106 converts the color of the white light emitted from the organic light-emitting layer 113. The white, red, green and blue color filter patterns W-CF, R-CF, G-CF and B-CF of the color conversion layer 106 are disposed to correspond to the emission areas EA of the white, red, green and blue subpixels W-SP, R-SP, G-SP and B-SP, respectively.

An antireflection film 120 is further disposed on the outer surface of the encapsulation substrate 104. The antireflection film 120 increases the absorption of the external light and the reflected external light.

In the organic light-emitting diode display device 100 according to the second embodiment of the present disclosure, a scattering pattern 200 is further provided on the outer surface of the encapsulation substrate 104 corresponding to the white subpixel W-SP. The scattering pattern 200 may be interposed between the encapsulation substrate 104 and the antireflection film 120. The scattering pattern 200 can include a transparent resin and a light diffusion material in the transparent resin, and the light diffusion material may be a bead.

The bead has a characteristic of preventing the light from being partially concentrated by dispersing the light incident on the scattering pattern 200.

A material having high transparency, improved light transmittance and easy viscosity control may be used as the transparent resin. For example, an acrylic, urethane, epoxy, vinyl, polyester, or polyamide resin can be used as the transparent resin.

The bead may be formed of an inorganic material such as $SiO_2$ or other materials. Alternatively, the bead may be formed of calcium carbonate, barium sulfate, silica, titanium oxide, glass, or poly(methyl methacrylate) (PMMA).

The scattering pattern 200 may be a fine pattern directly formed on the encapsulation substrate 104 without the light diffusion material such as the bead. The light scattering angle can be adjusted according to the shape of the fine pattern. The fine pattern can be variously configured as an elliptical pattern, a polygonal pattern, or the like. The hologram pattern may be used to refract the incident light by the interference pattern towards an asymmetric direction thereto, so that the concentrated light can be diffused at a more inclined angle.

In other way, the scattering pattern 200 may include the light diffusion material such as the bead in the transparent resin, and the fine pattern may be further formed on the surface of the scattering pattern 200. Alternatively, the scattering pattern 200 may be formed such that a plurality of fine unevenness may be provided on the surface, thereby having a surface roughness.

Here, the surface roughness refers to irregular unevenness formed on the surface of the processed material and having a short period and relatively small amplitude. The fine unevenness having such a roughness can be formed on the surface of the scattering pattern 200 according to the first embodiment of the present disclosure.

In the organic light-emitting diode display device 100 according to the second embodiment of the present disclosure, a light diffusion material such as a bead may be further included in the white color filter pattern W-CF disposed to correspond to the white subpixel W-SP.

At this time, the scattering pattern 200 and the white color filter pattern W-CF may have a total haze value of 45(±5)%.

The scattering pattern 200 and the white color filter pattern W-CF may refract and scatter the incident light, so that the external light reflectance of the white subpixel W-SP can be further lowered.

Particularly, by lowering the external light reflectance in the white subpixel W-SP as described above, it is possible to prevent the occurrence of the rainbow phenomenon, so that the visibility can be prevented from deteriorating due to the rainbow phenomenon and the viewer's eye fatigue can also be prevented from occurring.

In addition, it is possible to prevent the external light reflectance from increasing at the side view, and thus it is also possible to prevent the black visibility in the off state from deteriorating, thereby improving the outdoor visibility and the contrast ratio.

In particular, by including the light diffusion material in the white color filter pattern W-CF, the light extraction effect can improved by the white color filter pattern W-CF in the process of outputting light emitted from the organic light-emitting layer 113, and the light extraction effect can be further improved in the process that the light passes through the scattering pattern 200 again.

Accordingly, the emission efficiency of the internal light can be further increased.

Third Embodiment

Figure 7:
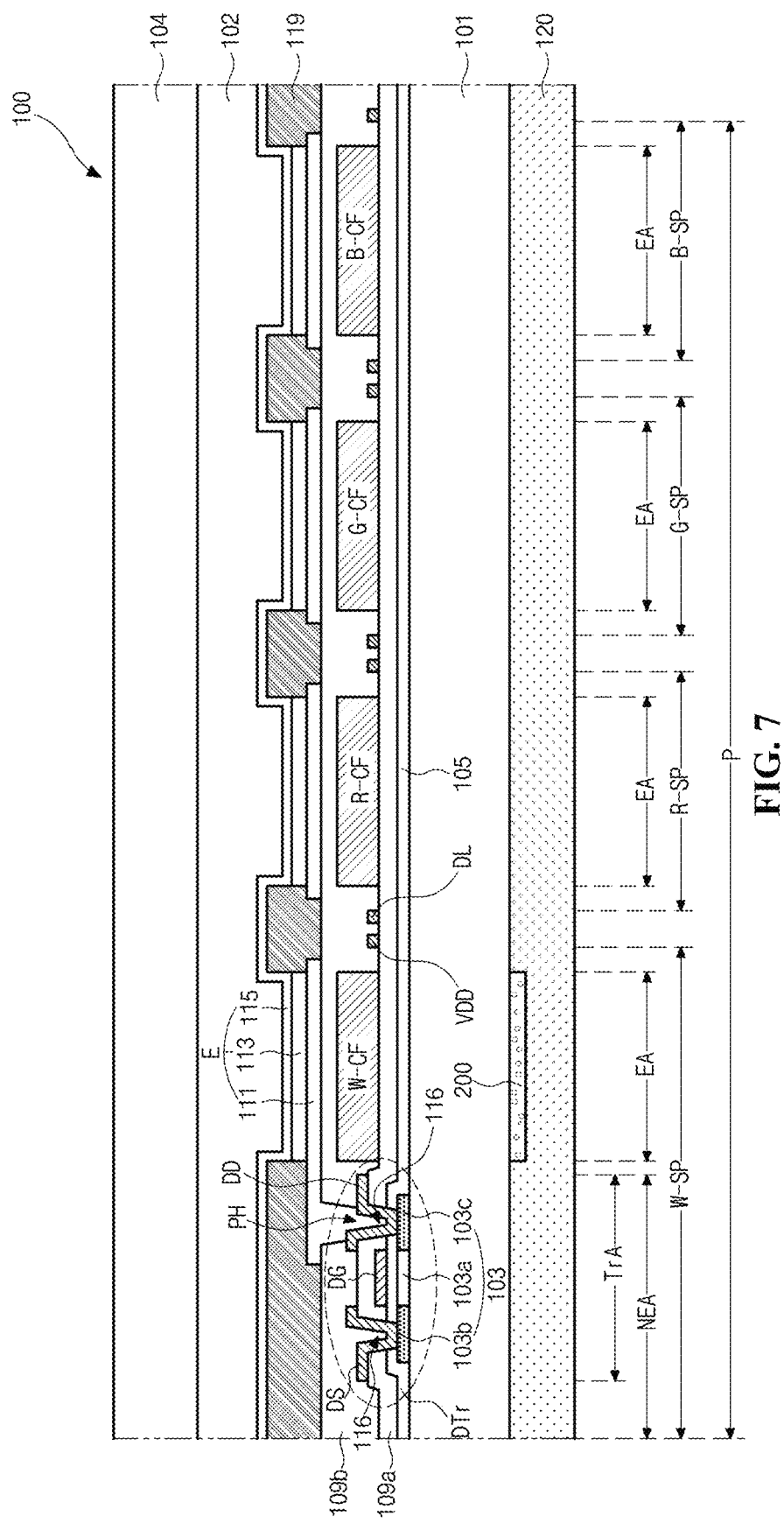
FIG. 7 is a cross-sectional view of an organic light-emitting diode display device according to a third embodiment of the present disclosure and shows a structure of a unit pixel including four subpixels.

FIG. 7 is a cross-sectional view of an organic light-emitting diode display device according to a third embodiment of the present disclosure and shows a structure of a unit pixel including four subpixels. The organic light-emitting diode display device according to the third embodiment of the present disclosure is a bottom emission type.

For convenience of description, the same parts as those of the first and second embodiments are designated by the same reference signs, and explanation for the same parts will be shortened or omitted.

In FIG. 7, a driving thin film transistor DTr including a semiconductor layer 103, a gate insulation layer 105, a gate electrode DG, and source and drain electrodes DS and DD is disposed in a switching area TrA of a non-emission area NEA on a substrate 101, and white, red, green and blue color filter patterns W-CF, R-CF, G-CF and B-CF are disposed on a first interlayer insulation layer 109a corresponding to emission areas EA of white, red, green and blue subpixels W-SP, R-SP, G-SP and B-SP, respectively.

A second interlayer insulation layer 109b is disposed on the white, red, green and blue color filter patterns W-CF, R-CF, G-CF and B-CF, and a first electrode 111 connected to the drain electrode DD exposed through a drain contact hole PH, which is formed in the gate insulation layer 105 and the first interlayer insulation layer 109a, is disposed on the second interlayer insulation layer 109b.

At this time, the first electrode 111 is disposed for each subpixel W-SP, R-SP, G-SP and B-SP, and a bank 119 is disposed between adjacent first electrodes 111.

An organic light-emitting layer 113 is disposed on the first electrode 111 exposed by the bank 119, and a second electrode 115 is disposed on the organic light-emitting layer 113 substantially all over the substrate 101. The first electrode 111 may function as an anode electrode and the second electrode 115 may function as a cathode electrode.

A passivation layer 102 and an encapsulation substrate 104 in the form of a thin film are sequentially disposed over the driving thin film transistor DTr and the light-emitting diode E, thereby encapsulating the organic light-emitting diode display device 100.

The organic light-emitting diode display device 100 according to the third embodiment of the present disclosure is a bottom emission type, in which the white light emitted from the organic light-emitting layer 113 passes through the first electrode 111 and the white, red, green and blue color filter patterns W-CF, R-CF, G-CF and B-CF, thereby being outputted to the outside, and finally, the organic light-emitting diode display device 100 implements a predetermined or selected image.

An antireflection film 120 is further disposed on an outer surface of the substrate 101 corresponding to the emission direction of the light emitted from the organic light-emitting layer 113. The antireflection film 120 increases the absorption of the external light and the reflected external light.

Additionally, in the organic light-emitting diode display device 100 according to the third embodiment of the present disclosure, a scattering pattern 200 is further provided between the substrate 101 and the antireflection film 120 corresponding to the white subpixel W-SP.

The scattering pattern 200 can include a transparent resin and a light diffusion material in the transparent resin, and the light diffusion material may be a bead. Alternatively, the scattering pattern 200 may be a fine pattern directly formed on the surface of the substrate 101 without the light diffusion material such as the bead.

In other way, the scattering pattern 200 may include the light diffusion material such as the bead in the transparent resin, and the fine pattern may be further formed on the surface of the scattering pattern 200. Alternatively, the scattering pattern 200 may be formed such that a plurality of fine unevenness may be provided on the surface, thereby having a surface roughness.

The scattering pattern 200 may refract and scatter the incident light, so that the external light reflectance of the white subpixel W-SP can be further lowered.

Particularly, by lowering the external light reflectance in the white subpixel W-SP as described above, the organic light-emitting diode display device 100 according to the third embodiment of the present disclosure can prevent the occurrence of the rainbow phenomenon, which is an interference spot caused by the external light reflection, deteriorating visibility and also causing the eye fatigue. The occurrence of the rainbow phenomenon can be prevented, so that the visibility can be prevented from deteriorating due to the rainbow phenomenon and the viewer's eye fatigue can also be prevented from occurring.

In addition, it is possible to prevent the external light reflectance from increasing at the side view, and thus it is also possible to prevent the black visibility in the off state from deteriorating, thereby improving the outdoor visibility and the contrast ratio.

Through this, it is possible to implement the organic light-emitting diode display device 100 capable of realizing an image with improved color tones.

Meanwhile, in the description so far, it has been described and illustrated as an example that the scattering pattern 200 is disposed to correspond to the white subpixel W-SP. However, in an organic light-emitting diode display device in which the white subpixel is not provided and a full color image is implemented by the red, green and blue subpixels R-SP, G-SP and B-SP, the scattering pattern 200 can be disposed to correspond to a subpixel having the highest area reflectance among the red, green and blue subpixels R-SP, G-SP and B-SP.

That is, referring to Table 1 above, the scattering pattern 200 can be disposed to correspond to the green subpixel G-SP having the largest area reflectance among the red, green and blue subpixels R-SP, G-SP and B-SP excluding the white subpixel W-SP.

Further, in the description so far, it has been described and illustrated as an example that the scattering pattern 200 is disposed on the outer surface of the encapsulation substrate 102 or the substrate 101, but the scattering pattern 200 can be disposed at any position between the organic light-emitting layer 113 and the antireflection film 120.

As described above, since the organic light-emitting diode display device of the present disclosure includes the antireflection film with the light absorption layer, there is an effect of reducing or minimizing the external light reflectance while improving the luminance as compared to an organic light-emitting diode display device including a circular polarizer.

In addition, by disposing the scattering pattern between the organic light-emitting layer and the antireflection film corresponding to the white subpixel, the rainbow phenomenon due to the external light reflection can be prevented from occurring, and thus there is an effect of preventing the visibility from deteriorating due to the rainbow phenomenon and also preventing the viewer's eye fatigue from occurring.

Further, the external light reflectance can be prevented from increasing at the side view, and thus there is an effect of preventing the black visibility in the off state from deteriorating, thereby improving the outdoor visibility and the contrast ratio.

Through this, there is an effect of implementing the organic light-emitting diode display device capable of realizing an image with improved color tones.

It will be apparent to those skilled in the art that various modifications and variations can be made in the display device of the present disclosure without departing from the technical idea or scope of the disclosure. Thus, it is intended that the present disclosure cover the modifications and variations of this disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An organic light-emitting diode display device, comprising:
   a first substrate having thereon first, second, and third subpixels;
   first, second, and third light-emitting diodes disposed in the first, second, and third subpixels on the first substrate, respectively;
   a second substrate over the first, second, and third light-emitting diodes;
   first, second, and third color filter patterns on and overlapping the first, second, and third light-emitting diodes, respectively, from a plan view, and
   a scattering pattern on the second substrate and the first, second, and third color filter patterns, the scattering pattern overlapping the first light-emitting diode and the first color filter pattern from a plan view,
   wherein the first subpixel has an area reflectance higher than the second and third subpixels,
   wherein no scattering pattern is provided to correspond to the second and third subpixels, and
   wherein the light-emitting diodes, the color filter patterns, and the scattering pattern are stacked sequentially on top of one another.

2. The organic light-emitting diode display device of claim 1, wherein the first, second, and third subpixels include red, green, and blue subpixels, and the first subpixel is the green subpixel.

3. The organic light-emitting diode display device of claim 2, wherein the scattering pattern is disposed over the first light-emitting diode and is a fine pattern formed on a surface of the second substrate.

4. The organic light-emitting diode display device of claim 1, wherein the scattering pattern includes a transparent resin and a light diffusion material including a bead in the transparent resin.

5. The organic light-emitting diode display device of claim 1, further comprising a fourth subpixel,
   wherein the first, second, third, and fourth subpixels include red, green, blue, and white subpixels, and
   wherein the first subpixel is the white subpixel, and the fourth subpixel is the green subpixel.

6. The organic light-emitting diode display device of claim 5, wherein the first color filter pattern is a white color filter pattern disposed to overlap the white subpixel from a plan view, and
   wherein the white color filter pattern includes a light diffusion material having a bead.

7. The organic light-emitting diode display device of claim 1, further comprising an antireflection film including a light absorption layer on an outer surface of the second substrate.

8. The organic light-emitting diode display device of claim 7, wherein the scattering pattern is disposed between the second substrate and the antireflection film.

9. The organic light-emitting diode display device of claim 7, wherein the antireflection film is in direct contact with the second substrate.

10. The organic light-emitting diode display device of claim 7, wherein the light absorption layer is formed of at least one of an adhesive or a support layer in which a light absorbing material is included.

11. The organic light-emitting diode display device of claim 1, further comprising an antireflection film including a light absorption layer on an outer surface of the first substrate.

12. The organic light-emitting diode display device of claim 11, wherein the scattering pattern is disposed between the first substrate and the antireflection film.

13. The organic light-emitting diode display device of claim 1, wherein the scattering pattern includes a plurality of fine unevenness and has a surface roughness.

14. An organic light-emitting diode display device, comprising:
    a first substrate;
    first, second, and third light-emitting diodes on the first substrate;
    first, second, and third color filter patterns on and overlapping the first, second, and third light-emitting diodes, respectively, from a plan view,
    a second substrate on the first, second, and third color filter patterns; and
    a scattering pattern on the second substrate, the scattering pattern overlapping both the first light-emitting diode and the first color filter pattern from a plan view,
    wherein no scattering pattern overlaps with the second and third light-emitting diodes from a plan view, and
    wherein the first light-emitting diode, the first color filter patterns, and the scattering pattern are stacked sequentially on top of one another.

15. The organic light-emitting diode display device of claim 14, wherein the scattering pattern includes a transparent resin and a light diffusion material including a bead in the transparent resin.

16. The organic light-emitting diode display device of claim 14, wherein the first color filter pattern is a white color filter pattern, and
    wherein the white color filter pattern includes a light diffusion material having a bead.

17. The organic light-emitting diode display device of claim 14, further comprising an antireflection film including a light absorption layer on the second substrate and the scattering pattern.

18. The organic light-emitting diode display device of claim 17, wherein the scattering pattern is disposed between the second substrate and the antireflection film.

19. The organic light-emitting diode display device of claim 17, wherein the antireflection film is in direct contact with the second substrate.

20. The organic light-emitting diode display device of claim 14, wherein the scattering pattern includes a plurality of fine unevenness and has a surface roughness.

\* \* \* \* \*